United States Patent
Nishie et al.

(10) Patent No.: US 9,287,490 B2
(45) Date of Patent: Mar. 15, 2016

(54) LAMINATED PIEZOELECTRIC ELEMENT AND MULTI-FEED DETECTION SENSOR

(71) Applicant: MURATA MANUFACTURING CO., LTD., Nagaokakyo-Shi, Kyoto-fu (JP)

(72) Inventors: Junichi Nishie, Nagaokakyo (JP); Chikashi Kondo, Nagaokakyo (JP); Junshi Ota, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 65 days.

(21) Appl. No.: 14/286,208

(22) Filed: May 23, 2014

(65) Prior Publication Data

US 2014/0252917 A1    Sep. 11, 2014

Related U.S. Application Data

(63) Continuation of application No. PCT/JP2012/080271, filed on Nov. 22, 2012.

(30) Foreign Application Priority Data

Nov. 28, 2011    (JP) .................................. 2011-258896

(51) Int. Cl.
*H01L 41/08*    (2006.01)
*H01L 41/113*    (2006.01)
(Continued)

(52) U.S. Cl.
CPC ............ *H01L 41/1132* (2013.01); *B06B 1/067* (2013.01); *B06B 1/0611* (2013.01); *B65H 7/125* (2013.01); *B65H 2553/30* (2013.01)

(58) Field of Classification Search
CPC ...... H01L 41/083; A61B 8/14; B06B 1/0622; B06B 1/064

USPC .................................. 310/328; 600/437, 459
See application file for complete search history.

(56) References Cited

U.S. PATENT DOCUMENTS

| | | | | |
|---|---|---|---|---|
| 4,434,384 A | * | 2/1984 | Dunnrowicz | ......... B06B 1/0622 |
| | | | | 310/325 |
| 4,680,499 A | * | 7/1987 | Umemura | .............. G10K 11/02 |
| | | | | 310/327 |

(Continued)

FOREIGN PATENT DOCUMENTS

| | | |
|---|---|---|
| GB | 2 048 613 A | 12/1980 |
| JP | 62051400 A * | 3/1987 |

(Continued)

OTHER PUBLICATIONS

PCT/JP2012/080271 Written Opinion dated Feb. 13, 2013.
(Continued)

*Primary Examiner* — J. San Martin
(74) *Attorney, Agent, or Firm* — Arent Fox LLP (57) ABSTRACT

A laminated piezoelectric element that includes a piezoelectric element layer and a matching layer. The piezoelectric element layer is configured to have a plurality of piezoelectric layers and a plurality of electrode layers laminated together. The matching layer is laminated on the piezoelectric element layer, and is different in acoustic impedance from the piezoelectric element layer. When Vp represents the acoustic velocity in the piezoelectric element layer, Vm represents the acoustic velocity in the matching layer, Tp represents the thickness dimension of the piezoelectric element layer, and Tm represents the thickness dimension of the matching layer, Vp/Vm=Tp/Tm holds. Further, when W represents the dimension of the laminated piezoelectric element in the width direction, Tp+Tm>W holds.

18 Claims, 6 Drawing Sheets

(51) Int. Cl.
   *B65H 7/12*   (2006.01)
   *B06B 1/06*   (2006.01)

(56) References Cited

U.S. PATENT DOCUMENTS

| | | | |
|---|---|---|---|
| 5,511,296 A * | 4/1996 | Dias | G10K 11/02 |
| | | | 29/25.35 |
| 5,743,855 A * | 4/1998 | Hanafy | B06B 1/0644 |
| | | | 600/459 |
| 6,437,484 B1 * | 8/2002 | Nishimura | H03H 9/0509 |
| | | | 310/324 |
| 2002/0153809 A1 * | 10/2002 | Chen | H01L 41/1875 |
| | | | 310/360 |
| 2005/0189707 A1 | 9/2005 | Sano et al. | |
| 2005/0194865 A1 * | 9/2005 | Angelsen | B06B 1/0692 |
| | | | 310/334 |
| 2008/0111651 A1 * | 5/2008 | Isobe | H03H 3/02 |
| | | | 333/187 |
| 2011/0050039 A1 * | 3/2011 | Toda | B06B 1/0622 |
| | | | 310/327 |
| 2011/0237952 A1 * | 9/2011 | Ooishi | A61B 8/00 |
| | | | 600/459 |
| 2012/0007472 A1 * | 1/2012 | Tai | B06B 1/0644 |
| | | | 310/335 |
| 2013/0085390 A1 * | 4/2013 | Nishikubo | H01L 41/083 |
| | | | 600/443 |
| 2014/0023109 A1 * | 1/2014 | Ballandras | G01K 11/26 |
| | | | 374/117 |

FOREIGN PATENT DOCUMENTS

| | | | |
|---|---|---|---|
| JP | 62-070707 | | 4/1987 |
| JP | 06-327098 | | 11/1994 |
| JP | 10-224895 | | 8/1998 |
| JP | 11-115192 | | 4/1999 |
| JP | 11215594 A | * | 8/1999 |
| JP | 2004-064381 A | | 2/2004 |
| JP | 2005-108989 A | | 4/2005 |
| JP | 2005-123554 A | | 5/2005 |
| JP | 2005-192388 A | | 7/2005 |
| JP | 2007-022793 A | | 2/2007 |
| JP | 2011-003990 A | | 1/2011 |

OTHER PUBLICATIONS

PCT/JP2012/080271 ISR dated Feb. 13, 2013.

* cited by examiner

LAMINATED PIEZOELECTRIC ELEMENT AND MULTI-FEED DETECTION SENSOR

CROSS REFERENCE TO RELATED APPLICATIONS

The present application is a continuation of International application No. PCT/JP2012/080271, filed Nov. 22, 2012, which claims priority to Japanese Patent Application No. 2011-258896, filed Nov. 28, 2011, the entire contents of each of which are incorporated herein by reference.

FIELD OF THE INVENTION

The present invention relates to a laminated piezoelectric element having a structure in which piezoelectric layers and electrode layers are laminated, and a multi-feed detection sensor that transmits and receives acoustic waves by using laminated piezoelectric elements and detects multi-feed of sheets in a printer or the like. The present invention particularly relates to a laminated piezoelectric element in which thickness vibration occurs in a lamination direction of piezoelectric layers and electrode layers, and a multi-feed detection sensor using the laminated piezoelectric elements.

BACKGROUND OF THE INVENTION

A multi-feed detection sensor that detects multi-feed of sheets in a printer or the like uses piezoelectric elements.

The multi-feed detection sensor includes a pair of piezoelectric elements spaced from each other by a few centimeters with a sheet feed path interposed therebetween. One of the piezoelectric elements is configured for transmission, and the other piezoelectric element is configured for reception. A certain amount of installation space is required to provide the multi-feed detection sensor. In the past, therefore, the multi-feed detection sensor has been employed in a large- or medium-sized printer or scanner. In recent years, however, there has been an increasing demand for a reduction in size of the multi-feed detection sensor to allow the multi-feed detection sensor to also be mounted in a small-sized apparatus.

In an existing multi-feed detection sensor, a piezoelectric element in which area vibration occurs is bonded to, for example, an inner bottom surface of a cylindrical case with a bottom, to thereby configure a bimorph oscillator in which bending vibration occurs in the bottom surface of the case serving as a vibrating surface. The bending vibration occurs such that the center of the vibrating surface corresponds to the antinode of the vibration, and that a peripheral portion of the vibrating surface corresponds to the node of the vibration.
Patent Document 1: Japanese Unexamined Patent Application Publication No. 10-224895

SUMMARY OF THE INVENTION

In the design of a small-sized piezoelectric element, a simple reduction in size of the existing multi-feed detection sensor results in a substantial reduction in vibration area at the center of the vibrating surface. Thus, degradation of electrical characteristics (sound pressure) is inevitable. Further, an increase in acoustic wave frequency due to the reduction in size is also inevitable. The increase in acoustic wave frequency tends to increase the attenuation of acoustic waves at the time of passage of a sheet. It is therefore necessary to increase the amplification factor in a receiving circuit. Further, in the existing multi-feed detection sensor, unnecessary vibration occurs at a frequency close to the resonant frequency. If the resonant frequency shifts owing to, for example, variations in materials, sensor characteristics are degraded by the influence of the unnecessary vibration.

Therefore, an object of the present invention is to realize a multi-feed detection sensor and a laminated piezoelectric element easily realizing favorable sensor characteristics when employed in a multi-feed detection sensor, not causing degradation of electrical characteristics and an increase in acoustic wave frequency irrespective of a reduction in size, and not susceptible to unnecessary vibration.

A laminated piezoelectric element of the present invention includes a piezoelectric element layer and a matching layer. The piezoelectric element layer has a plurality of piezoelectric layers and a plurality of electrode layers laminated in a thickness direction. The matching layer is laminated on the piezoelectric element layer in the thickness direction, and different in acoustic impedance from the piezoelectric element layer. Herein, in the laminated piezoelectric element, when $V_p$ represents the acoustic velocity in the piezoelectric element layer, $V_m$ represents the acoustic velocity in the matching layer, $f$ represents the acoustic wave frequency, $T_p$ represents the thickness dimension of the piezoelectric element layer in a lamination direction of the piezoelectric layers and the electrode layers, and $T_m$ represents the thickness dimension of the matching layer, $V_p/V_m = T_p/T_m$ holds. Further, when $W$ represents the width dimension of the piezoelectric element, $T_p + T_m > W$ holds.

With the respective thickness dimensions of the piezoelectric element layer and the matching layer set as described above, the thickness of each of the layers is equal to a quarter wavelength of acoustic waves at a specific acoustic wave frequency. When thickness vibration (longitudinal vibration) occurs in the piezoelectric element layer, therefore, it is possible to maximize the displacement amount relative to the thickness vibration in each of the piezoelectric element layer and the matching layer. Further, in that case, if $T_p + T_m > W$ holds, it is possible to substantially separate the resonant frequency of a vibration mode substantially affected by the width dimension of the piezoelectric element, such as a bending vibration mode in the thickness direction or an area vibration mode in an in-plane direction, for example, from the resonant frequency of the thickness vibration mode. That is, it is possible to suppress unnecessary vibration, while maximizing the sensitivity and sound pressure due to the thickness vibration at a specific acoustic wave frequency. In the thickness vibration, the entirety of a surface of the matching layer is substantially uniformly displaced (vibrates) in the normal direction. Thus, the node of the vibration is not generated in the surface of the matching layer, and it is possible to increase the vibration area. Even if the overall dimension of the laminated piezoelectric element is reduced, therefore, a reduction in sensitivity and sound pressure of the acoustic waves due to the thickness vibration and a change in resonant frequency are unlikely to be caused.

In the above-described laminated piezoelectric element, it is preferable that $W = k_1 \times (T_p + T_m)$ holds in which a coefficient $k_1$ is greater than 0 and is equal to or less than $1/1.39$. It is more preferable that the coefficient $k_1$ is equal to or less than $1/1.88$.

With the thus set width dimension, it is possible to substantially suppress the unnecessary vibration and thereby obtain only the thickness vibration.

In the above-described laminated piezoelectric element, it is preferable that the coefficient $k_1$ is equal to or greater than $1/2.27$. It is more preferable that the coefficient $k_1$ is equal to or greater than $1/1.99$.

With the thus set width dimension, it is possible to prevent a reduction in area of the vibrating surface and a substantial reduction in vibration level.

A multi-feed detection sensor according to the present invention includes the laminated piezoelectric element for wave transmission and the laminated piezoelectric element for wave reception, and the two laminated piezoelectric elements are spaced from each other with a detection position interposed therebetween.

In the above-described multi-feed detection sensor, it is preferable that the number of laminations of the piezoelectric layers and the electrode layers in the laminated piezoelectric element for wave transmission is large, and that the number of laminations of the piezoelectric layers and the electrode layers in the laminated piezoelectric element for wave reception is small.

It is possible to increase the sound pressure of the acoustic waves to be transmitted by increasing the number of laminations of the piezoelectric layers and the electrode layers in the laminated piezoelectric element for wave transmission. Further, it is possible to increase the sensitivity of acoustic wave reception by reducing the number of laminations in the laminated piezoelectric element for wave reception. Accordingly, it is possible to realize favorable sensor characteristics in the multi-feed detection sensor.

In the above-described multi-feed detection sensor, it is preferable that the acoustic wave frequency f is equal to or higher than 100 kHz.

With the use of such acoustic waves, it is possible to detect multi-feed of commonly commercially available sheets of almost all types and thicknesses. Further, for example, in a case in which the piezoelectric layers use PZT-based ceramics and the matching layer uses a low specific gravity material of a mixture of epoxy resin with glass balloon, if the acoustic wave frequency is 100 kHz, the thickness dimension of the laminated piezoelectric element is approximately 12.5 mm or less and the width dimension of the laminated piezoelectric element ranges from approximately 6.28 mm to approximately 6.65 mm in accordance with all of the above-described conditions. Further, if the acoustic wave frequency is 166.7 kHz, which is higher than 100 kHz, the thickness dimension of the laminated piezoelectric element is approximately 7.5 mm or less, and the width dimension of the laminated piezoelectric element ranges from approximately 3.77 mm to approximately 3.99 mm. As described above, even if the acoustic wave frequency is increased and the thickness dimension of the laminated piezoelectric element is reduced, it is possible to optimize the dimensions of the respective portions and thereby prevent degradation of sensor characteristics and a change in resonant frequency. Accordingly, it is possible to obtain a substantially small configuration, as compared with existing products (in the order of a few centimeters). A PZT material has a feature of having a large electromechanical coupling coefficient, a large d constant, and a small machinery quality factor. A low specific gravity material of a mixture of epoxy-based thermosetting resin with glass balloon is advantageous in being bondable by potting and thus reducing costs.

According to the present invention, with the respective thickness dimensions and width dimensions of the piezoelectric element layer and the matching layer set to appropriate values, it is possible to obtain the maximum displacement in each of the piezoelectric element layer and the matching layer, and to cause thickness vibration (longitudinal vibration) in the piezoelectric element layer while preventing the occurrence of unnecessary vibration. Accordingly, the entirety of a surface of the matching layer is displaced (vibrates) in the normal direction. Even if the thickness dimension of the laminated piezoelectric element is reduced for size reduction, therefore, degradation of electrical characteristics and an increase in acoustic wave frequency are unlikely to be caused, and it is possible to configure a laminated piezoelectric element suitable for a multi-feed detection sensor.

DETAILED DESCRIPTION OF THE PREFERRED EMBODIMENTS

On the basis of FIGS. 1(A) to 1(C), description will be given below of a configuration of a laminated piezoelectric element and a multi-feed detection sensor according to a first embodiment of the present invention.

Figure 1A:
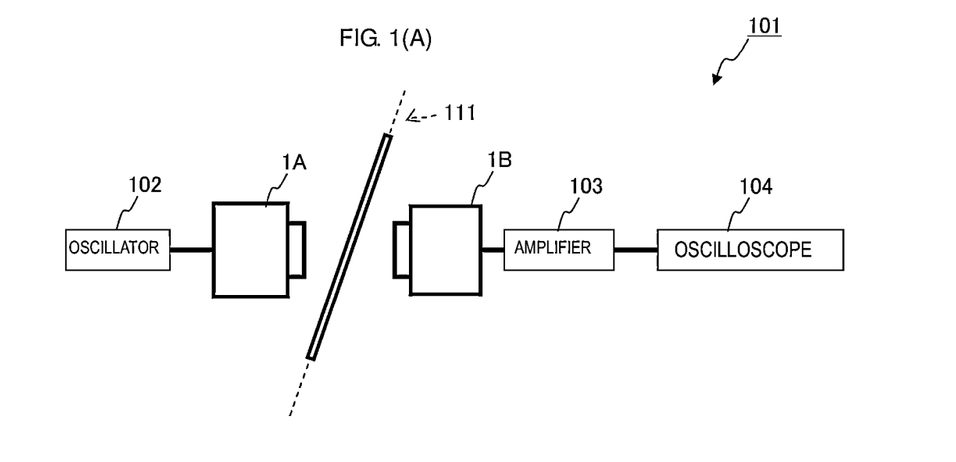
FIGS. 1(A) to 1(C) are a development diagram and a cross-sectional view of a configuration example of a laminated piezoelectric element and a multi-feed detection sensor according to a first embodiment of the present invention.

FIG. 1(A) is a conceptual diagram of a multi-feed detection sensor 101 according to the present embodiment.

The multi-feed detection sensor 101 includes an ultrasonic transducer 1A for wave transmission and an ultrasonic transducer 1B for wave reception. The multi-feed detection sensor 101 also includes an oscillator 102 connected to the ultrasonic transducer 1A, an oscilloscope 104 connected to the ultrasonic transducer 1B, and an amplifier 103 connected between the ultrasonic transducer 1B and the oscilloscope 104. The ultrasonic transducer 1A and the ultrasonic transducer 1B are disposed to face each other on opposite sides of a sheet feed path 111 in a printer or the like. The oscillator 102 oscillates a frequency pulse signal for driving the ultrasonic transducer 1A. The ultrasonic transducer 1A receives the frequency pulse signal and transmits ultrasonic pulses to the sheet feed path 111. On the sheet feed path 111, the ultrasonic pulses are transmitted through a sheet being transported and reach the ultrasonic transducer 1B. The ultrasonic transducer 1B receives the ultrasonic pulses and outputs a detection signal. The amplifier 103 amplifies the detection signal input from the ultrasonic transducer 1B. On the basis of the detection signal amplified by the amplifier 103, the oscilloscope 104 determines the occurrence or non-occurrence of multi-feed of sheets on the sheet feed path 111.

Figure 1B:
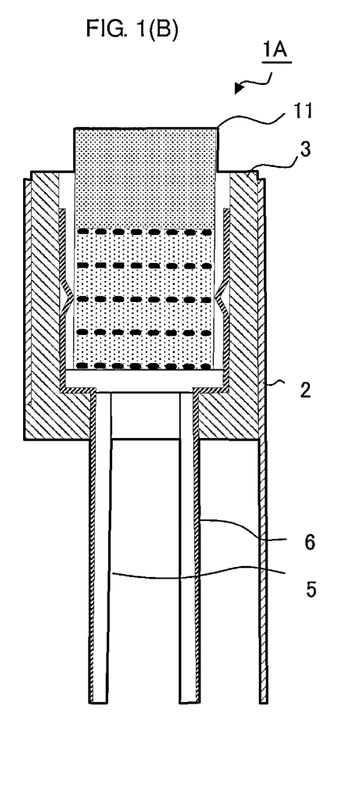

FIG. 1(B) is a cross-sectional view of the ultrasonic transducer 1A according to the present embodiment. The upward direction in the drawing plane of FIG. 1(B) corresponds to the direction of transmitting ultrasonic waves, i.e., the direction toward the front surface of the ultrasonic transducer 1A.

The ultrasonic transducer 1B is substantially the same in configuration as the ultrasonic transducer 1A. Herein, detailed description thereof will be omitted. The ultrasonic transducer 1B is different from the ultrasonic transducer 1A in overall dimension and the number of laminations of piezoelectric layers and electrode layers in a laminated piezoelectric element 11.

The ultrasonic transducer 1A includes a metal cover 2, a resin case 3, the laminated piezoelectric element 11 (hereinafter simply referred to as the piezoelectric element 11), and metal terminals 5 and 6.

The resin case 3 is formed by injection-molding a plastic resin, and has a cylindrical shape with a bottom and a front surface formed with an opening. The resin case 3 holds the piezoelectric element 11 such that an end portion of the piezoelectric element 11 projects toward the front surface from the opening. The piezoelectric element 11 may be bonded to, for example, an inner bottom surface of the resin case 3.

The metal cover 2 is made of a conductive metal material, and has a cylindrical shape with a front surface and a rear surface each formed with an opening. The metal cover 2 holds the resin case 3.

The metal terminals 5 and 6 are made of a conductive metal material and configured such that the longitudinal direction thereof corresponds to the direction of transmitting acoustic waves. Each of the metal terminals 5 and 6 includes a step portion bent twice near the center thereof, and is locked on the inner bottom surface of the resin case 3 at the step portion, with a rear surface-side end portion thereof projecting from the rear surface of the resin case 3 and a front surface-side end portion thereof sandwiched between a side surface of the piezoelectric element 11 and an inner side surface of the resin case 3 inside the opening of the resin case 3. The front surface-side end portion of each of the metal terminals 5 and 6 includes a V-shaped portion formed to be bent to project toward the piezoelectric element 11. This portion is configured to elastically deform to be in constant contact with the piezoelectric element 11. The metal terminal 5 is disposed on the side of a left side surface of the piezoelectric element 11. The metal terminal 6 is disposed on the side of a right side surface of the piezoelectric element 11. The V-shaped portion or the like of each of the metal terminals 5 and 6 may be bonded to the side surface of the piezoelectric element 11 with a conductive adhesive or the like.

Figure 1C:
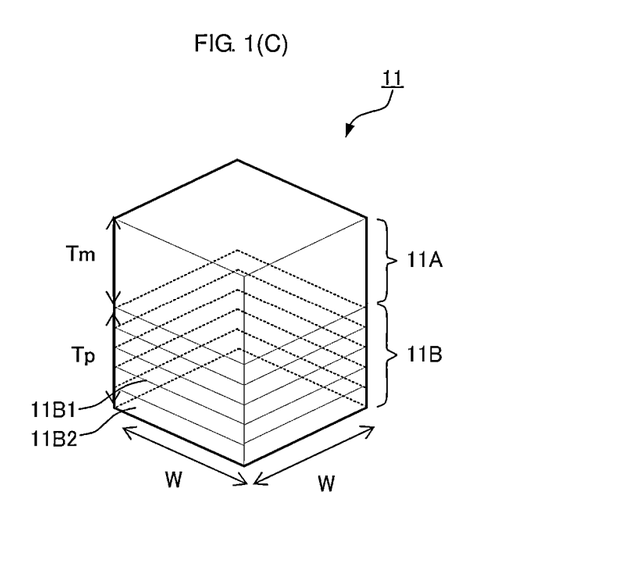

FIG. 1(C) is a perspective view of the piezoelectric element 11 according to the present embodiment. The upward direction in the drawing plane of FIG. 1(C) corresponds to the direction of transmitting or receiving ultrasonic waves, i.e., the direction toward the front surface of the piezoelectric element 11. The piezoelectric element 11 includes a matching layer 11A and a piezoelectric element layer 11B. The piezoelectric element 11 has a columnar shape having a square front surface and a square rear surface located in a lamination direction of the matching layer 11A and the piezoelectric element layer 11B. It is preferable that each of the front surface and the rear surface of the piezoelectric element 11 has a square or circular shape, since the shape makes it possible to increase the vibration efficiency and prevent the occurrence of unnecessary vibration. Each of the front surface and the rear surface, however, may have a rectangular or elliptical shape to control the directivity of the acoustic waves.

The matching layer 11A is made of a low specific gravity material of a mixture of epoxy resin with glass balloon, which is bondable by potting and thermosetting. The matching layer 11A is located on the front surface side of the piezoelectric element 11, and is provided to match the acoustic impedance between the piezoelectric element layer 11B and the external space (outside air).

The piezoelectric element layer 11B is located on the rear surface side of the piezoelectric element 11, and is configured to have a plurality of electrode layers 11B1 and a plurality of piezoelectric layers 11B2 laminated in a lamination direction corresponding to the direction between a front surface and a rear surface thereof. The piezoelectric layers 11B2 are made of PZT-based ceramics having a large electromechanical coupling coefficient, a large piezoelectric d constant, and a small machinery quality factor. The piezoelectric element 11 is configured such that two side surfaces thereof parallel to the lamination direction (a right side surface and a left side surface located in the lateral direction in the drawing plane of FIG. 1(B)) serve as electrode connecting portions. With not-illustrated side surface electrodes and insulating films, even- or odd-numbered ones of the electrode layers 11B1 are selectively connected together, and are connected to the metal terminal 5 or 6.

The above-described members, i.e., the metal cover 2, the resin case 3, the piezoelectric element 11, and the metal terminals 5 and 6 form the ultrasonic transducer 1A. Respective portions of the piezoelectric element 11 are set to later-described dimensions to cause thickness vibration along the direction between the front surface and the rear surface. Therefore, the entire front surface of the piezoelectric element 11 serves as a vibration area, and a reduction in size of the piezoelectric element 11 is unlikely to cause degradation of electrical characteristics and an increase in acoustic wave frequency. Accordingly, the multi-feed detection sensor 101 is capable of realizing favorable sensor characteristics.

On the basis of a verification test using an actual apparatus, description will now be given of frequencies of the acoustic waves at which the multi-feed detection sensor 101 is capable of detecting multi-feed of various types of commonly used sheets. In the verification test using an actual apparatus, the installation gap between the ultrasonic transducers 1A and 1B was set to 70 mm, and the sheet detection position was set to the center of the installation gap between the ultrasonic transducers 1A and 1B. Further, the angle of passage of the sheet was set to 25°.

Figure 2A:
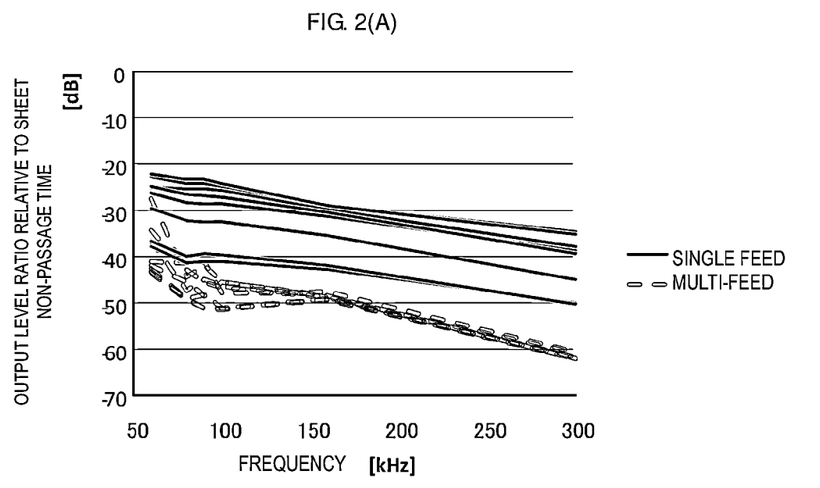
FIGS. 2(A) and 2(B) are diagrams illustrating the relationship between the acoustic wave frequency and the signal output level of the multi-feed detection sensor illustrated in FIGS. 1(A) to 1(C).
Figure 2B:
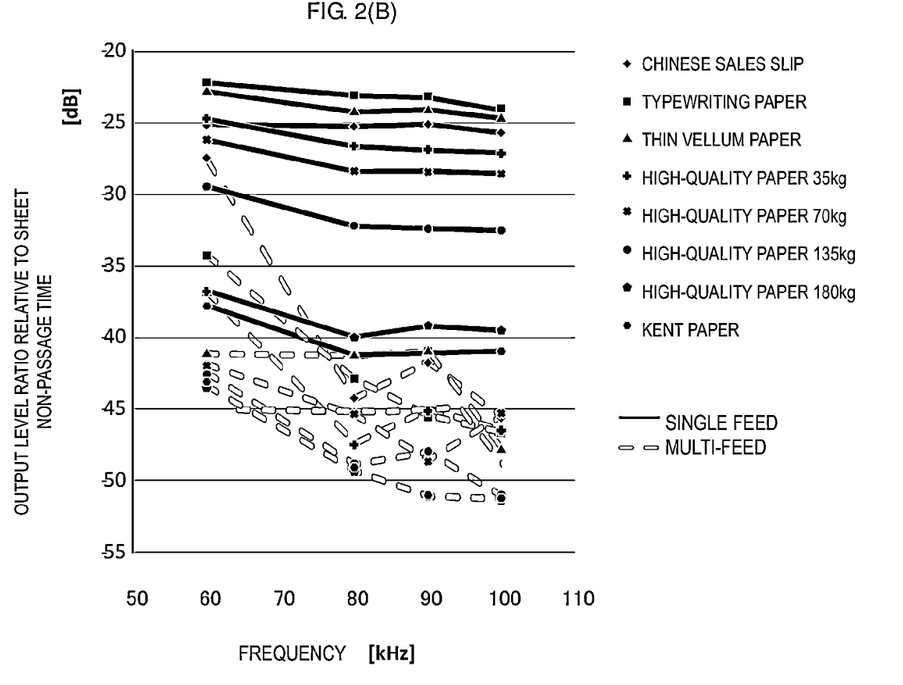
Figure 3A:
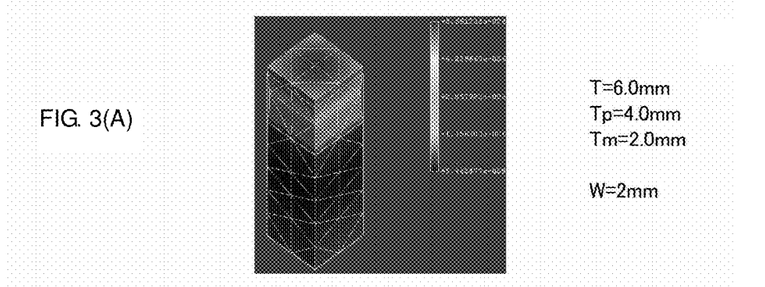
FIGS. 3(A) to 3(D) are diagrams illustrating the relationship between the width dimension and the vibration mode of the laminated piezoelectric element illustrated in FIGS. 1(A) to 1(C).
Figure 3B:
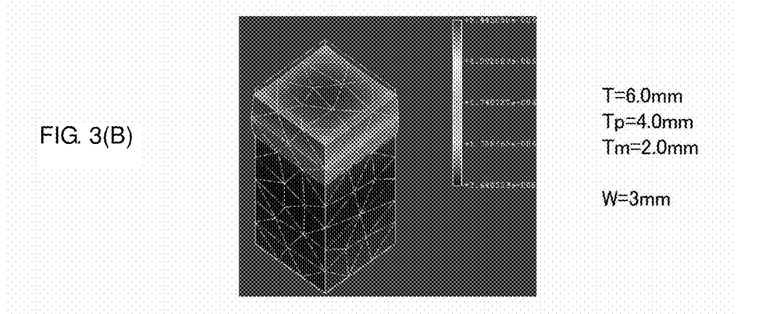
Figure 3C:
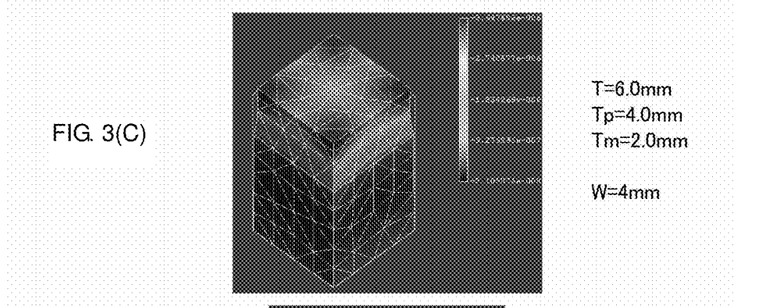
Figure 3D:
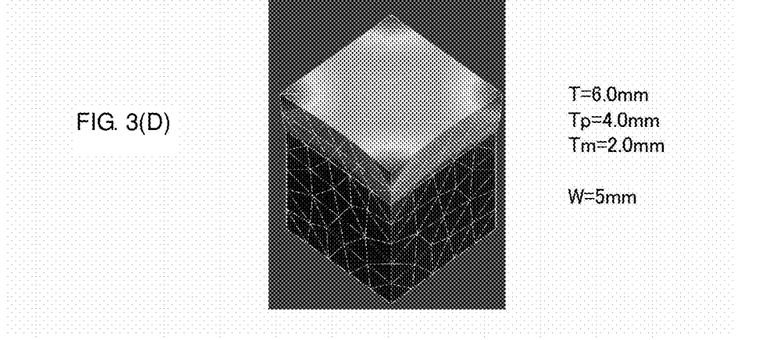

FIGS. 2(A) and 2(B) are diagrams each illustrating changes in output level of the detection signal in respective states in which the various types of sheets are present at the sheet detection position, with reference to the state in which no sheet is present at the sheet detection position. FIG. 2(A) is a diagram illustrating a frequency range of 50 kHz to 300 kHz, and FIG. 2(B) is a diagram illustrating a frequency range of 60 kHz to 100 kHz in an enlarged scale. In the diagrams, each solid line indicates a single sheet feed state (a state in which only one sheet is being fed), and each broken line indicates a multi-sheet feed state (a state in which a plurality of sheets are being fed). Further, plot figures illustrated in the legend indicate sheet types. Herein, Chinese sales slip, type-writing paper, thin vellum paper, high-quality paper of different thicknesses (each value in kg indicates the A-size ream weight (the weight of a stack of 1000 A-size sheets)), and Kent paper are used.

To identify the multi-feed state of each of the various types of sheets illustrated herein, it is necessary to distinguish between the single feed state indicated by the solid lines and the multi-feed state indicated by the broken lines by using some kind of threshold. As illustrated in FIG. 2(A), in a low frequency range, the solid lines and the broken lines intercross and are not distinguishable by a threshold. In a high frequency range, however, the solid lines and the broken lines are clearly separated and distinguishable by a threshold. It is observed from FIG. 2(B) that the solid lines and the broken lines intercross in a range up to approximately 90 kHz, but that the solid lines and the broken lines are clearly separated at a frequency higher than approximately 100 kHz. It is therefore understood that, at a frequency higher than approximately 100 kHz, it is possible to distinguish between the single sheet layer state and the multi-sheet feed state by setting the threshold to a sound pressure level at which the solid lines and the broken lines are distinguishable.

If the frequency is constant, the attenuation of the acoustic waves in the sheet is determined in accordance with the sheet type (including the sheet thickness). There is no substantial variation in attenuation among multi-feed detection sensors using thickness vibration, even if the multi-feed detection sensors are different in specific configuration. It is therefore understood that a multi-feed detection sensor using thickness vibration is capable of detecting the multi-feed of commonly used types of sheets by using the acoustic waves at a frequency higher than approximately 100 kHz.

The setting of dimensions of the piezoelectric element 11 will now be described in detail. As described above, the matching layer 11A forming the piezoelectric element 11 is made of a low specific gravity material of a mixture of epoxy resin with glass balloon, and exhibits physical properties illustrated in the following table. In the table, values in parentheses indicate the respective ranges of the physical properties generally obtainable from a similar material.

TABLE 1

| Density $\rho m$ [kg/m3] | Acoustic velocity Vm [m/s] | Young's modulus [GPa] | Poisson's ratio |
|---|---|---|---|
| 560 (500-700) | 2200 (1750-2750) | 1.8 (1.5-2.5) | 0.3 (0.25-0.35) |

As described above, the piezoelectric element layer 11B of the piezoelectric element 11 is made of PZT-based ceramics, and exhibits physical properties illustrated in the following table. In the table, values in parentheses indicate the respective ranges of the physical properties generally obtainable from a similar material.

TABLE 2

| Density $\rho m$ [kg/m3] | Acoustic velocity Vp [m/s] | electro-mechanical coupling co-efficient kt [%] | piezoelectric constant d33 [×10⁻12 m/s] | machinery quality factor Qm |
|---|---|---|---|---|
| 7800 (7600-8000) | 2800 (2500-3500) | 51 (44-51) | 410 (200-650) | 80 (50-1000) |

It is considered that, if the piezoelectric element 11, in which thickness vibration occurs, is made of materials having such physical properties, the thickness dimension of the piezoelectric element 11 should be set as follows.

When Vp and Vm represent the acoustic velocity in the piezoelectric element layer 11B and the acoustic velocity in the matching layer 11A, respectively, and f represents the frequency of acoustic waves due to thickness vibration, a wavelength $\lambda p$ of acoustic waves in the piezoelectric element layer 11B and a wavelength $\lambda m$ of acoustic waves in the matching layer 11A are represented as $\lambda p = Vp/f$ and $\lambda m = Vm/f$, respectively. That is, if the frequency f of the acoustic waves is 100 kHz corresponding to the lowest frequency at which the multi-feed is detectable, $\lambda p = Vp/f = 2800/100000 = 28 \times 10^{-3}$ and $\lambda m = Vm/f = 2200/100000 = 22 \times 10^{-3}$ hold.

Further, it is considered that, when Tp and Tm represent the thickness dimension of the piezoelectric element layer 11B and the thickness dimension of the matching layer 11A, respectively, and each of the thickness dimensions is equal to a quarter wavelength of the acoustic velocity, the maximum displacement due to the thickness vibration is obtained in each of the surfaces of the layers, and the sensitivity and sound pressure of the acoustic waves due to the thickness vibration are maximized. Therefore, the thickness Tp of the piezoelectric element layer and the thickness Tm of the matching layer should be set as $Tp = \lambda p/4$ and $Tm = \lambda m/4$, respectively. That is, when the frequency f of the acoustic waves is set to 100 kHz, $Tp = \lambda p/4 = 28 \times 10^{-3}/4 = 7.0 \times 10^{-3}$ and $Tm = \lambda m/4 = 22 \times 10^{-3}/4 = 5.5 \times 10^{-3}$ should be set. In the piezoelectric element 11, therefore, when the frequency f of the acoustic waves is set to 100 kHz, the thickness dimension Tp of the piezoelectric element layer 11B and the thickness dimension Tm of the matching layer 11A are set to 7.0 mm and 5.5 mm, respectively, to obtain a total thickness T of 12.5 mm. Thereby, it is possible to maximize the sensitivity and sound pressure of the acoustic waves due to the thickness vibration, and configure the piezoelectric element 11 such that the thickness vibration mainly occurs therein.

The relationship of the following equation is derived from the above equations.

$$Tp/Tm = \lambda p/\lambda m = Vp/Vm$$

If the frequency f of the acoustic waves is higher than 100 kHz corresponding to the lowest frequency at which the multi-feed is detectable, the thickness dimension Tp of the piezoelectric element layer 11B is less than 7.0 mm, and the thickness dimension Tm of the matching layer 11A is less than 5.5 mm. Also in that case, if the thickness ratio between the piezoelectric element layer 11B and the matching layer 11A is optimized to be equal to the acoustic velocity ratio therebetween, it is possible to obtain the maximum sensitivity and sound pressure due to the thickness vibration at a specific frequency higher than 100 kHz.

The setting of a width dimension W (longitudinal or lateral dimension in the present embodiment) of the piezoelectric element 11 will now be discussed. FIGS. 3(A) to 3(D) are diagrams illustrating vibration modes of surfaces of the piezoelectric element 11 based on simulation.

If the width dimension W of the piezoelectric element 11 is changed with the thickness dimension T of the piezoelectric element 11 unchanged, the vibration mode in the surfaces of the piezoelectric element 11 changes in accordance with the width dimension W of the piezoelectric element 11. For example, if the width dimension W is small, the entire surfaces of the piezoelectric element 11 exhibit substantially uniform displacement. If the width dimension W is large, however, the displacement amount of the surfaces of the piezoelectric element 11 substantially varies depending on the position. This is considered to be because the unnecessary vibration is substantially small as compared with the thickness vibration, when the width dimension W is small, and because the unnecessary vibration is large as compared with the thickness vibration, when the width dimension W is large.

Figure 4A:
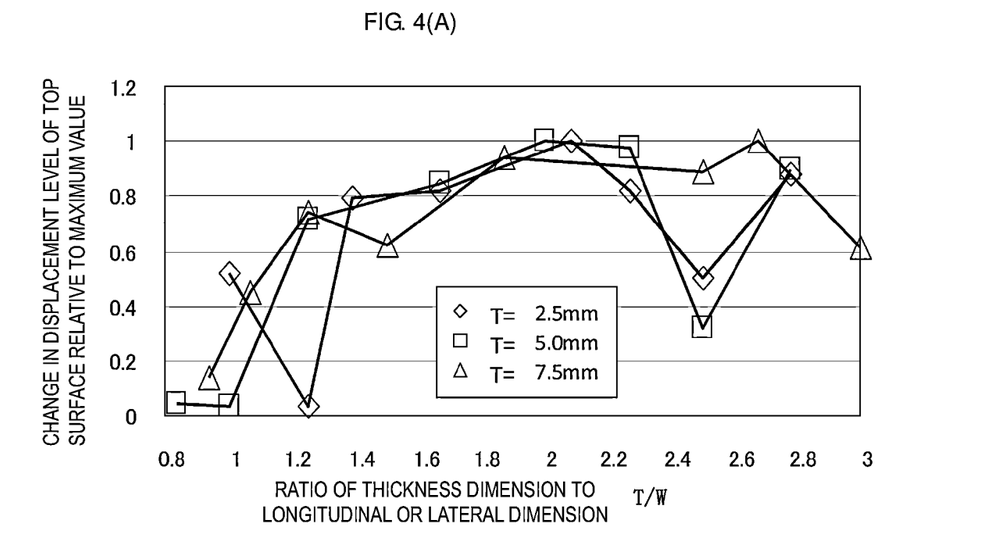
FIGS. 4(A) and 4(B) are diagrams illustrating the relationship between the dimensional ratio of the laminated piezoelectric element illustrated in FIGS. 1(A) to 1(C) and the vibration level of a top surface.

Therefore, the respective thicknesses of the layers were optimized with the physical properties illustrated in Tables 1 and 2 for each of different settings of the thickness dimension T of the piezoelectric element 11, and the relationship between the ratio of the thickness dimension T of the piezoelectric element 11 to the width dimension W and the change in displacement level (relative to the maximum value) of a top surface of the matching layer 11A was examined. FIG. 4(A) is a diagram illustrating the relationship between the aforementioned ratio and the displacement level of the top surface for each of the different settings of the thickness dimension T of the piezoelectric element 11. A taller shape is obtained toward the right side of the diagram, and a flatter shape is obtained toward the left side of the diagram.

Figure 4B:
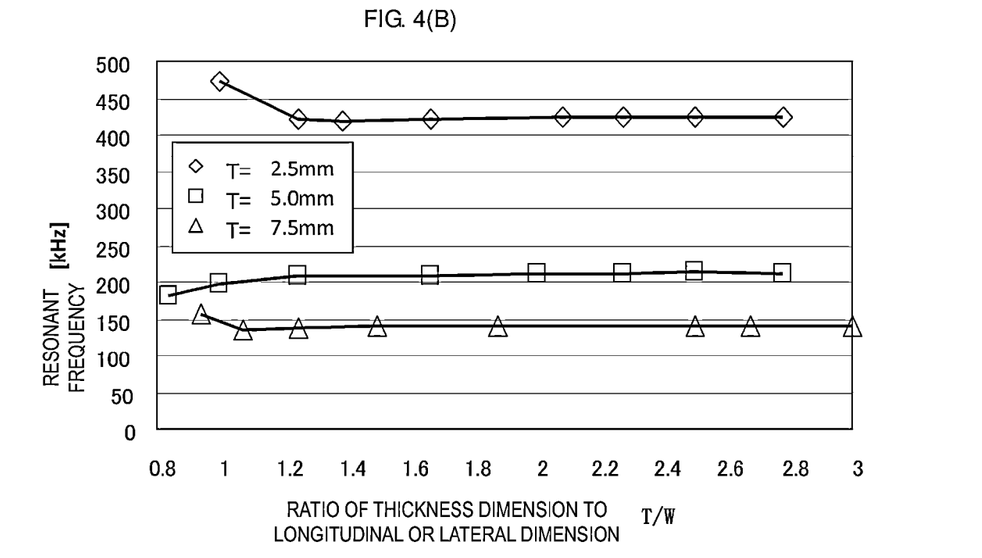

FIG. 4(B) is a diagram illustrating the relationship between the aforementioned ratio and the resonant frequency of the entire piezoelectric element 11 with the same settings. Plot figures illustrated in the legends of FIGS. 4(A) and 4(B) indicate similar examples having the optimized thicknesses of the respective layers and the thickness dimension T of the piezoelectric element 11 set to different values of 2.5 mm, 5.0 mm, and 7.5 mm, respectively.

When the thickness dimension T of the piezoelectric element 11 was 2.5 mm, the displacement level of the top surface and the resonant frequency were unstable with the aforementioned ratio less than approximately 1.39. Further, when the thickness dimension T of the piezoelectric element 11 was 5.0 mm, the displacement level of the top surface and the resonant frequency were unstable with the aforementioned ratio less than approximately 1.25. Furthermore, when the thickness dimension T of the piezoelectric element 11 was 7.5 mm, the displacement level of the top surface and the resonant frequency were unstable with the aforementioned ratio less than approximately 1.25.

According to these settings, with the aforementioned ratio greater than at least 1.39, it was possible to obtain a large displacement level of the top surface irrespective of the thickness dimension T of the piezoelectric element 11, and the resonant frequency was stable. Particularly with the aforementioned ratio in a numerical value range greater than 1.88, it was possible to maximize the displacement level of the top surface.

Figure 5A:
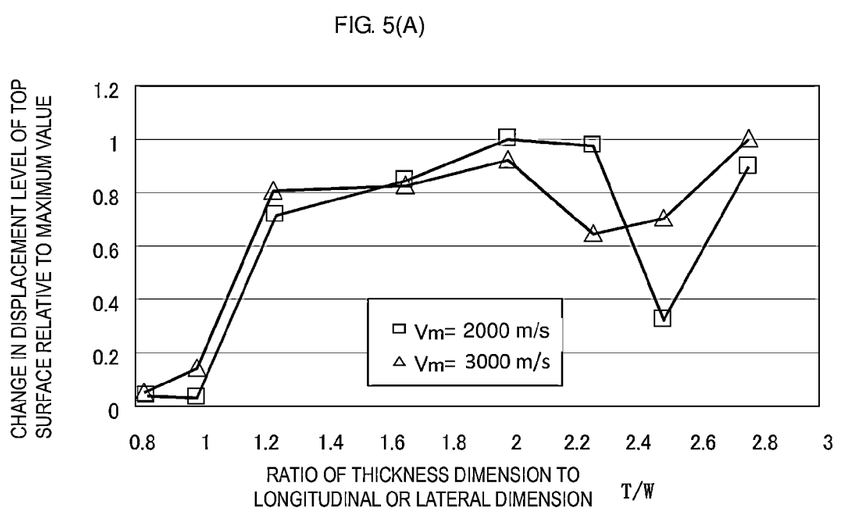
FIGS. 5(A) and 5(B) are diagrams illustrating the relationship between the dimensional ratio of the laminated piezoelectric element illustrated in FIGS. 1(A) to 1(C) and the vibration level of the top surface.

Then, the respective thicknesses of the layers were optimized with the thickness dimension T of the piezoelectric element 11 set to 5.0 mm for each of different settings of the acoustic velocity Vm of the matching layer, which is one of the physical properties, and the relationship between the ratio of the thickness dimension T of the piezoelectric element 11 to the width dimension W and the change in displacement level (relative to the maximum value) of the top surface of the matching layer 11A was examined. FIG. 5(A) is a diagram illustrating the relationship between the aforementioned ratio and the displacement level of the top surface for each of the different settings of the acoustic velocity Vm of the matching layer.

Figure 5B:
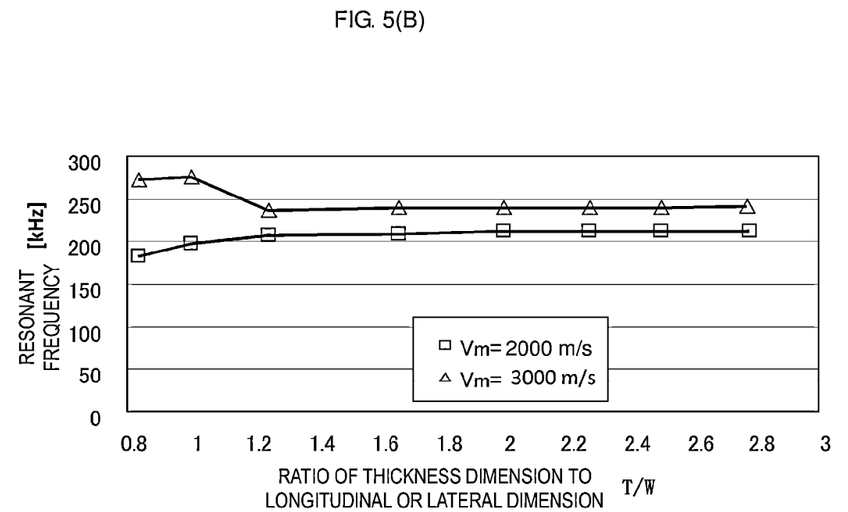

FIG. 5(B) is a diagram illustrating the relationship between the aforementioned ratio and the resonant frequency with the same settings. Plot figures illustrated in the legends of FIGS. 5(A) and 5(B) indicate similar examples with the optimized thicknesses of the respective layers and the acoustic velocity Vm of the matching layer set to different values of 2000 m/s and 3000 m/s, respectively.

When the acoustic velocity Vm of the matching layer was 2000 m/s, the displacement level of the top surface and the resonant frequency were unstable with the aforementioned ratio less than approximately 1.25. Further, also when the acoustic velocity Vm of the matching layer was 3000 m/s, the displacement level of the top surface and the resonant frequency were unstable with the aforementioned ratio less than approximately 1.25.

According to these settings, with the aforementioned ratio greater than at least 1.25, it was possible to obtain a large displacement level of the top surface irrespective of the acoustic velocity Vm of the matching layer 11A, and the resonant frequency was stable. Particularly with the aforementioned ratio in a numerical value range greater than 1.66, it was possible to maximize the displacement level of the top surface.

The relationship between the vibration area and the vibration level of the top surface will now be discussed.

With reference again to FIG. 4(A), when the thickness dimension T of the piezoelectric element 11 was 2.5 mm, there was a case in which the displacement level of the top surface was reduced with the aforementioned ratio greater than approximately 2.27. Further, also when the thickness dimension T of the piezoelectric element 11 was 5.0 mm, there was a case in which the displacement level of the top surface was reduced with the aforementioned ratio greater than approximately 2.27. When the thickness dimension T of the piezoelectric element 11 was 7.5 mm, there was no substantial reduction in displacement level of the top surface even with the aforementioned ratio greater than approximately 2.27.

With reference to FIG. 5(A), when the acoustic velocity Vm of the matching layer was 2000 m/s, there was a case in which the displacement level of the top surface was reduced with the aforementioned ratio greater than approximately 2.27. When the acoustic velocity Vm of the matching layer was 3000 m/s, there was a certain amount of reduction in displacement level of the top surface with the aforementioned ratio of approximately 2.27. Even in that case, however, the displacement level exceeded 60% of the maximum value.

It is considered from these that the aforementioned ratio greater than approximately 2.27 results in a reduction in vibration area and may cause a substantial reduction in vibration level of the top surface.

It is considered from these that the width dimension W should be set as follows to obtain a favorable vibration mode of the piezoelectric element 11.

$W = k1 \times T$ wherein $1/2.27 \le k1 \le 1/1.39$

Especially for optimization, it is considered that the width dimension W should be set around approximately ½ of the thickness dimension T with $1/2.27 \le k1 \le 1/1.88$.

That is, it is considered that, when the frequency f of the acoustic waves and the total thickness dimension T of the piezoelectric element 11 are set to 100 kHz and 12.5 mm, respectively, as described above, the width dimension W of the piezoelectric element 11 should be set in the following numerical value range.

$5.5 \le W \le 6.6$

With such a setting, it is possible to configure the laminated piezoelectric element 11 in which the thickness vibration occurs with the maximized amplitude, while preventing the appearance of unnecessary vibration.

Figure 6A:
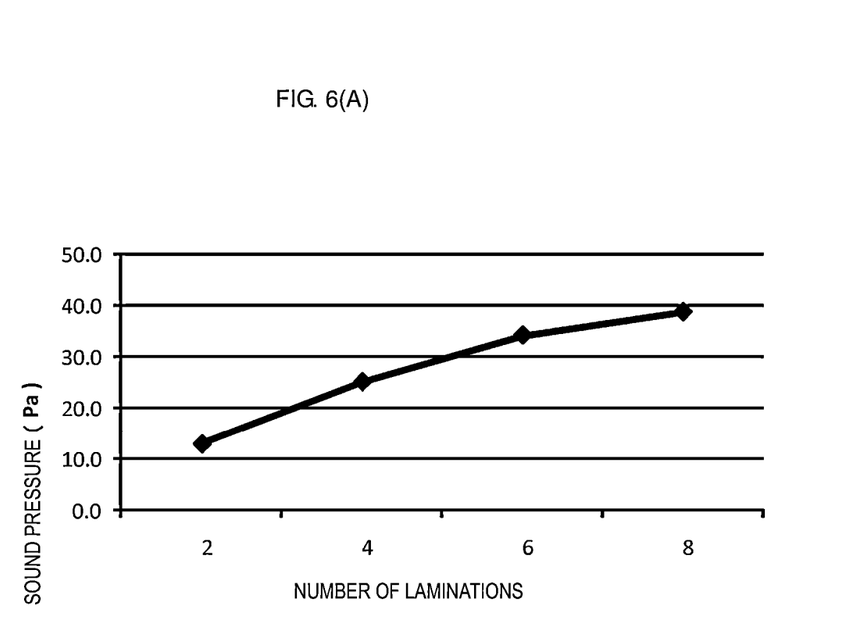
FIGS. 6(A) and 6(B) are diagrams illustrating the relationship between sensor characteristics and the number of laminations of piezoelectric layers in each of laminated piezoelectric elements of the multi-feed detection sensor illustrated in FIGS. 1(A) to 1(C).

The setting of the number n of laminations of the piezoelectric layers of the piezoelectric element 11 will now be discussed. FIG. 6(A) is a diagram illustrating the relationship between the sound pressure and the number n of laminations of the piezoelectric layers in the ultrasonic transducer 1A, which is based on simulation. Herein, the sound pressure was measured in a state in which the respective thicknesses of the piezoelectric element 11 and the piezoelectric element layer 11B were unchanged and only the number n of laminations of the piezoelectric layers (and electrode layers) was changed.

As a result, it was confirmed that, in the ultrasonic transducer 1A for wave transmission, the sound pressure increases in accordance with the increase in the number n of laminations.

Figure 6B:
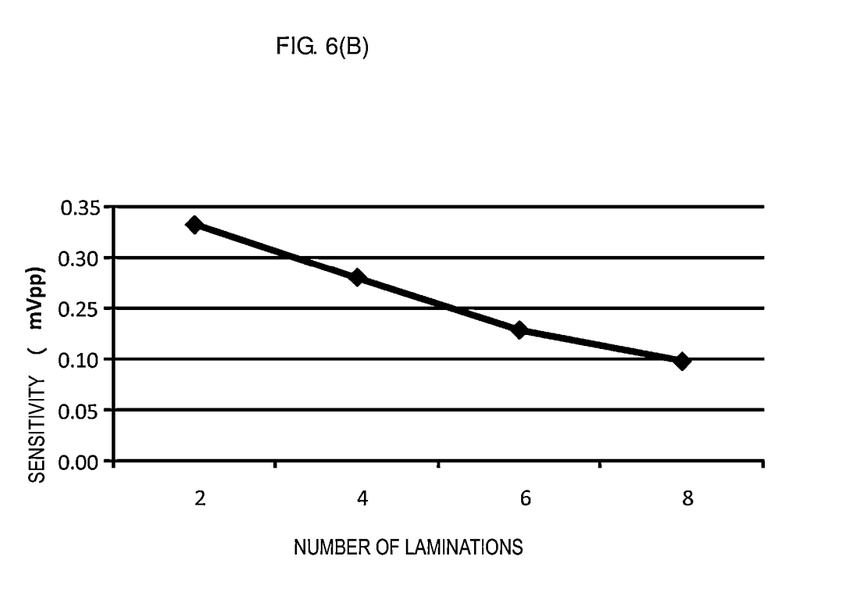

Further, FIG. 6(B) is a diagram illustrating the relationship between the sensitivity and the number n of laminations of the piezoelectric layers in the ultrasonic transducer 1B, which is based on simulation. In the ultrasonic transducer 1B for wave reception, the sensitivity decreases in accordance with the increase in the number n of laminations, and higher sensitivity characteristics were obtained in accordance with the reduction in the number n of laminations, contrary to the transducer for wave transmission. It is understood from this that it is possible to improve sensor characteristics of the multi-feed detection sensor 101, if the ultrasonic transducers 1A and 1B used as a pair are configured such that the number of laminations of the piezoelectric layers and the electrode layers is different therebetween, and that the transducer for wave transmission has a multilayer structure larger in the number of layers than the transducer for wave reception.

The present invention may be implemented as described in the foregoing embodiment. However, a specific configuration of the multi-feed detection sensor and the laminated piezoelectric element is not limited to the above-described one. For example, the piezoelectric element layer and the matching layer of the laminated piezoelectric element are not limited to the above-described materials, and may be made of other materials. Further, the number of laminations of the piezoelectric layers and the electrode layers may be appropriately set, and is not limited to the above-described one.

REFERENCE SIGNS LIST 1A, 1B ultrasonic transducer
2 metal cover
3 resin case
5, 6 metal terminal
11 laminated piezoelectric element
11A matching layer
11B piezoelectric element layer
11B1 electrode layer
11B2 piezoelectric layer
101 multi-feed detection sensor
102 oscillator
103 amplifier
104 oscilloscope
111 sheet feed path

The invention claimed is:

1. A laminated piezoelectric element comprising:
a piezoelectric element layer having a plurality of piezoelectric layers and a plurality of electrode layers laminated in a thickness direction; and
a matching layer laminated on the piezoelectric element layer in the thickness direction, the matching layer being different in acoustic impedance from the piezoelectric element layer,
wherein, when Vp represents the acoustic velocity in the piezoelectric element layer, Vm represents the acoustic velocity in the matching layer, Tp represents the dimension of the piezoelectric element layer in the thickness direction, and Tm represents the dimension of the matching layer in the thickness direction, $Vp/Vm=Tp/Tm$, and
wherein, when W represents the dimension of the laminated piezoelectric element in a width direction perpendicular to the thickness direction, $Tp+Tm>W$.

2. The laminated piezoelectric element according to claim 1, wherein $W=k1\times(Tp+Tm)$, and the coefficient k1 is greater than 0 and is equal to or less than 1/1.39.

3. The laminated piezoelectric element according to claim 1, wherein $W=k1\times(Tp+Tm)$, and the coefficient k1 is greater than 0 and is equal to or less than 1/1.88.

4. The laminated piezoelectric element according to claim 1, wherein $W=k1\times(Tp+Tm)$, and the coefficient k1 is greater than 0 and is equal to or greater than 1/2.27.

5. The laminated piezoelectric element according to claim 1, wherein the acoustic impedance of the matching layer matches an acoustic impedance between the piezoelectric element layer and air.

6. A multi-feed detection sensor comprising:
a wave transmission ultrasonic transducer; and
a wave reception ultrasonic transducer spaced from the wave transmission ultrasonic transducer with a detection position interposed therebetween,
wherein at least one of the wave transmission ultrasonic transducer and the wave reception ultrasonic transducer is the laminated piezoelectric element according to claim 1.

7. The multi-feed detection sensor according to claim 6, wherein both the wave transmission ultrasonic transducer and the wave reception ultrasonic transducer are the laminated piezoelectric element.

8. The multi-feed detection sensor according to claim 7, wherein a number of laminations of the piezoelectric layers and the electrode layers in the laminated piezoelectric element of the wave transmission ultrasonic transducer is larger than a number of laminations of the piezoelectric layers and the electrode layers in the laminated piezoelectric element of the wave reception ultrasonic transducer.

9. The multi-feed detection sensor according to claim 6, wherein a frequency f of acoustic waves is equal to or higher than 100 kHz.

10. The multi-feed detection sensor according to claim 6, further comprising:
an oscillator connected to the wave transmission ultrasonic transducer;
an oscilloscope connected to the wave reception ultrasonic transducer; and
an amplifier connected between the oscilloscope and the wave reception ultrasonic transducer.

11. The multi-feed detection sensor according to claim 6, wherein $W=k1\times(Tp+Tm)$, and the coefficient k1 is greater than 0 and is equal to or less than 1/1.39.

12. The multi-feed detection sensor according to claim 6, wherein $W=k1\times(Tp+Tm)$, and the coefficient k1 is greater than 0 and is equal to or less than 1/1.88.

13. The multi-feed detection sensor according to claim 6, wherein $W=k1\times(Tp+Tm)$, and the coefficient k1 is greater than 0 and is equal to or greater than 1/2.27.

14. An ultrasonic transducer comprising:
the laminated piezoelectric element according to claim 1;
a resin case surrounding the laminated piezoelectric element and having first and second opposed open ends, the resin case holding the laminated piezoelectric element such that an end portion of the laminated piezoelectric element projects from the first open end; and
a pair of metal terminals extending into the resin case from the second open end and contacting the laminated piezoelectric element.

15. The ultrasonic transducer according to claim 11, further comprising a metal cover surrounding the resin case.

16. The ultrasonic transducer according to claim 11, wherein W=k1×(Tp+Tm), and the coefficient k1 is greater than 0 and is equal to or less than 1/1.39.

17. The ultrasonic transducer according to claim 11, wherein W=k1×(Tp+Tm), and the coefficient k1 is greater than 0 and is equal to or less than 1/1.88.

18. The ultrasonic transducer according to claim 11, wherein W=k1×(Tp+Tm), and the coefficient k1 is greater than 0 and is equal to or greater than 1/2.27.

* * * * *